(12) United States Patent
Yang

(10) Patent No.: US 12,154,958 B2
(45) Date of Patent: *Nov. 26, 2024

(54) SEMICONDUCTOR STRUCTURE

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/132,435

(22) Filed: Apr. 10, 2023

(65) Prior Publication Data

US 2023/0261071 A1 Aug. 17, 2023

Related U.S. Application Data

(63) Continuation of application No. 17/073,410, filed on Oct. 19, 2020, now Pat. No. 11,658,223.

(51) Int. Cl.
*H01L 29/423* (2006.01)
*H01L 29/66* (2006.01)
*H01L 29/792* (2006.01)

(52) U.S. Cl.
CPC .... *H01L 29/4234* (2013.01); *H01L 29/66833* (2013.01); *H01L 29/792* (2013.01)

(58) Field of Classification Search
CPC ........... H01L 29/4234; H01L 29/66833; H01L 29/792
See application file for complete search history.

(56) References Cited

U.S. PATENT DOCUMENTS

| | | |
|---|---|---|
| 7,759,734 B2 | 7/2010 | Liu |
| 8,722,508 B2 | 5/2014 | Botula |
| 8,901,604 B2 | 12/2014 | Mishra |
| 8,912,844 B2 | 12/2014 | Li |
| 9,012,996 B2 | 4/2015 | Zhong |
| 9,048,285 B2 | 6/2015 | Chen |
| 9,224,805 B2 | 12/2015 | Mishra |
| 9,558,951 B2 | 1/2017 | Arriagada |
| 9,705,173 B2 | 7/2017 | Li |
| 9,978,751 B2 | 5/2018 | Wang |
| 10,062,943 B2 | 8/2018 | Li |
| 10,109,474 B1 | 10/2018 | Wang |
| 10,153,342 B1 | 12/2018 | He |
| 10,262,986 B2 | 4/2019 | Dai |
| 10,460,980 B2 | 10/2019 | Verma |
| 2005/0082075 A1 | 4/2005 | Lien |
| 2006/0054976 A1* | 3/2006 | Verhoeven .......... H01L 29/7926 257/209 |
| 2007/0102745 A1 | 5/2007 | Hsu |

(Continued)

*Primary Examiner* — Mohammad M Choudhry
(74) *Attorney, Agent, or Firm* — Winston Hsu

(57) ABSTRACT

A semiconductor structure includes a substrate, an insulating layer disposed on the substrate, an active layer disposed on the insulating layer, a plurality of isolation structures in the active layer to define a first device region and a non-device region of the active layer, a first semiconductor device formed on the first device region of the active layer, and a charge trap structure extending through the non-device region of the active layer. In a plane view, the charge trap structure and the non-device region form concentric closed ring surrounding the first device region.

20 Claims, 11 Drawing Sheets

(56) References Cited

U.S. PATENT DOCUMENTS

| | | | |
|---|---|---|---|
| 2013/0083601 A1 | 4/2013 | Liu | |
| 2013/0087846 A1* | 4/2013 | Lee | H01L 21/32133 |
| | | | 257/E21.09 |
| 2015/0380429 A1 | 12/2015 | Lee | |
| 2015/0380431 A1* | 12/2015 | Kanamori | H10B 43/35 |
| | | | 257/324 |
| 2016/0093636 A1 | 3/2016 | Pang | |
| 2017/0033226 A1* | 2/2017 | Yamazaki | H01L 21/8258 |
| 2017/0170125 A1* | 6/2017 | Furumoto | H01L 23/5226 |
| 2018/0337043 A1 | 11/2018 | Englekirk | |

* cited by examiner

SEMICONDUCTOR STRUCTURE

CROSS REFERENCE TO RELATED APPLICATIONS

This application is a continuation application of U.S. application Ser. No. 17/073,410, filed on Oct. 19, 2020. The content of the application is incorporated herein by reference.

BACKGROUND OF THE INVENTION

1. Field of the Invention

The present invention relates to a semiconductor structure. More particularly, the present invention relates to a semiconductor structure including a charge trap layer and a charge trap structure formed on an SOI substrate.

2. Description of the Prior Art

Semiconductor-on-insulator (SOI) technology is an advanced semiconductor manufacturing technology in that the circuitry is formed on an SOI substrate. More specifically, the circuitry is formed in a semiconductor material layer which is isolated from the bulk substrate (such as a silicon substrate) by an electrically insulating layer (usually a buried oxide layer, BOX). One advantage of isolating the circuitry from the bulk substrate is a dramatic decrease in parasitic capacitance, which allows access to a more desirable power-speed performance horizon. Therefore, SOI structures are particularly appealing for high frequency applications such as radio frequency (RF) communication circuits.

However, the interface between the buried oxide layer and the silicon substrate constitutes an inversion layer due to the fixed positive charges of the oxide, which will generate a parasitic electric field and attracts negative parasitic charges to accumulate in the silicon substrate near the oxide/silicon interface. The negative parasitic charges may constitute an inversion layer and cause a parasitic surface conduction (PSC) in the silicon substrate. The PSC may induce harmonics into the signals produced and decoded by the RF devices and adversely influence the linearity and precision of the signals. In addition, parasitic charges may also arise in the semiconductor materials and/or dielectric materials between the semiconductor devices and cause cross-talk interferences to the RF devices. There exists a need in the art to overcome the deficiencies and limitations described hereinabove.

SUMMARY OF THE INVENTION

In light of the above, the present invention is directed to provide a semiconductor structure which may reduce the harmonic distortion and cross-talk of signals caused by parasitic charges by forming a charge trap layer and a charge trap structure around a device region of an active layer of an SOI substrate.

According to an embodiment of the present invention, a semiconductor structure is provided and includes a substrate, an insulating layer disposed on the substrate, an active layer disposed on the insulating layer, a plurality of isolation structures in the active layer to define a first device region and a non-device region of the active layer, a first semiconductor device formed on the first device region of the active layer, and a charge trap structure extending through the non-device region of the active layer. In a plane view, the charge trap structure and the non-device region form concentric closed rings that surround the first device region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
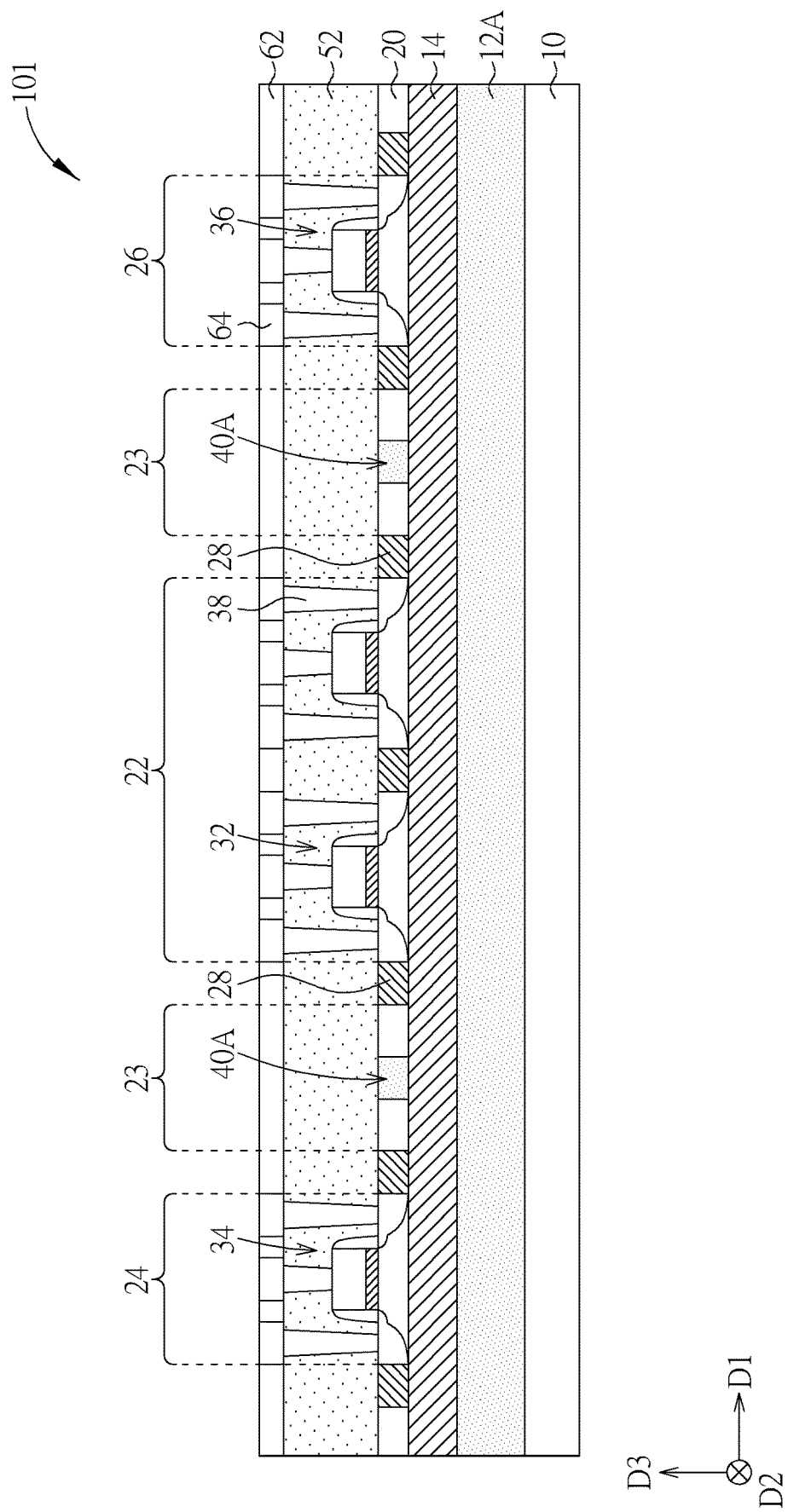
FIG. 1 is a schematic cross-sectional diagram showing a portion of a semiconductor structure according to a first embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

It will be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented.

The terms "wafer" and "substrate" used herein include any structure having an exposed surface onto which a layer is deposited according to the present invention, for example, to form the circuit structure. The term substrate is understood to include semiconductor wafers, but is not limited thereto. The term substrate is also used to refer to semiconductor structures during processing, and may include other layers that have been fabricated thereupon.

The terms "charge trap layer" and "charge trap structure" refer to a layer or a structure which is able to prevent parasitic charge accumulation and conduction by means of trap parasitic charges or interrupt the conductive path of the charges.

The present may be applied in semiconductor devices including SOI substrates. For example, the present may be applied in RF communication devices, power devices, photonics devices, image sensors, but is not limited thereto.

Figure 2:
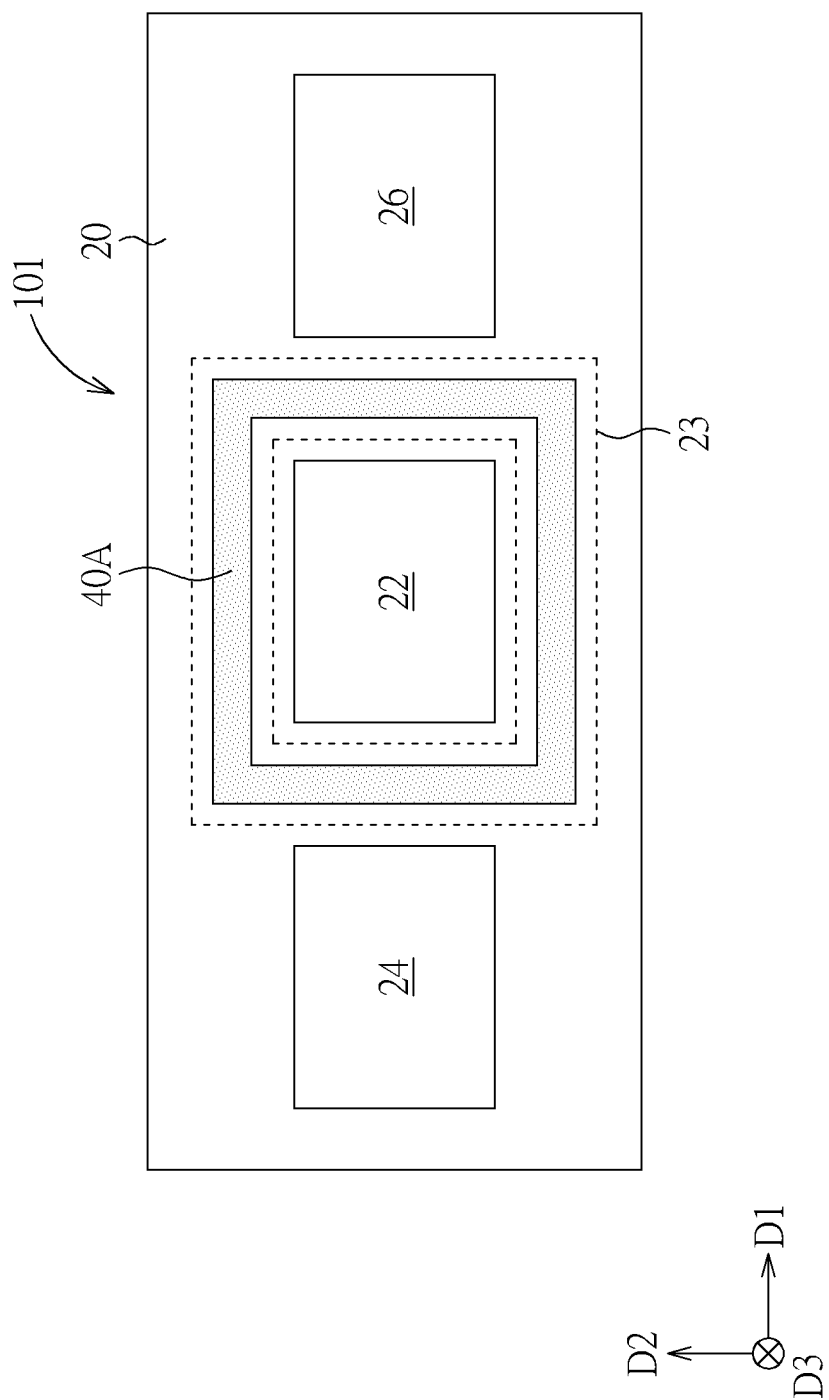
FIG. 2 is a schematic plane view showing a portion of the semiconductor structure in FIG. 1.

Please refer to FIG. 1 and FIG. 2. FIG. 1 is a schematic cross-sectional diagram along a first direction D1 and a third direction D3 to show a portion of a semiconductor structure 101 according to a first embodiment of the present invention. FIG. 2 is a schematic plane view along the first direction D1 and a second direction D2 to show a portion of the semiconductor structure 101 shown in FIG. 1. For the sake of simplicity, some structures (such as isolation structures, semiconductor devices, dielectric layers, contact structures, interconnecting structures) are omitted in FIG. 2. The first direction D1 and the second direction D2 may be perpendicular. The third direction D3 is vertical with respect to the plan defined by the first direction D1 and the second direction D2.

The semiconductor structure 101 shown in FIG. 1 and FIG. 2 includes a substrate 10, a charge trap layer 12A disposed on the substrate 10, an insulating layer 14 disposed on the charge trap layer 12A, and an active layer 20 disposed on the insulating layer 14. A first semiconductor device 32 is formed in a first device region 22 of the active layer 20. A charge trap structure 40A is formed in the active layer 20 and surrounds the first device region 22.

The substrate 10 may include silicon or any suitable semiconductor materials. In some embodiments, the substrate 10 may be a very lightly doped bulk silicon substrate and has a high resistivity.

The insulating layer 14 is disposed on the substrate 10 and used to electrically isolate the active layer 20 from the substrate 10. The insulating layer 14 may include silicon oxide ($SiO_2$) or any suitable dielectric material.

The active layer 20 may include any suitable semiconductor material such as silicon (Si), germanium (Ge), silicon-germanium (SiGe), carbon doped silicon germanium (SiGe: C), silicon carbide (SiC), or a combination thereof, but not limited thereto.

The first device region 22 is defined in the active layer 20 and has the first semiconductor device 32 formed therein. In some embodiments, the first device region 22 is a RF circuit region. The first device region 22 may include RF receiving circuits, RF transmitting circuits, analog-digital (AD) conversion circuits and/or digital-analog (DA) conversion circuits, but is not limited thereto.

In some embodiments, the active layer 20 may have more device regions. For example, as shown in FIG. 1 and FIG. 2, the active layer 20 may have a second device region 24 and a third device region 26 formed in different regions of the active layer 20 and adjacent to the first device region 22. The first device region 22, the second device region 24 and the third device region 26 do not overlap with each other in the plane view shown in FIG. 2. In some embodiments, the second device region 24 and the third device region 26 are non-RF circuit regions. The second device region 24 and the third device region 26 may include digital circuits or memory circuits, but are not limited thereto. A second semiconductor device 34 and a third semiconductor device 36 may be formed in the second device region 24 and the third device region 26, respectively.

The first semiconductor device 32, the second semiconductor device 34 and the third semiconductor device 36 may respectively include active devices such as field effect transistors (FETs), diodes, BJTs, or passive devices such as capacitors, inductors, resistors, but are not limited thereto. The active layer 20 may further have doping regions and/or salicide regions formed therein to form the first semiconductor device 32, the second semiconductor device 34 and the third semiconductor device 36.

A plurality of isolation structures 28 may be formed in the active layer 20 to define the device regions of the active layer 20 and electrically isolate the semiconductor devices in the device regions. The isolation structures 28 may extend through the whole thickness of the active layer 20. The bottom surface of the isolation structures 28 may directly contact an upper surface of the insulating layer 14. The isolation structures 28 may include a dielectric material such as silicon oxide ($SiO_2$), silicon nitride (SiN) or a combination thereof, but is not limited thereto.

The charge trap layer 12A is disposed between the insulating layer 14 and the substrate 10 and extends laterally (along the plane of first direction D1 and the second direction D2) to underlie the first device region 22, the second device region 24 and the third device region 26. More important, the charge trap layer 12A prevents the insulating layer 14 from directly contacting the substrate 10, such that the parasitic surface conduction (PSC) phenomenon caused by accumulation of parasitic charges near the surface of the substrate 10 induced the fixed positive charges of the insulating layer 14 may be reduced.

In some embodiments, the charge trap layer 12A is an electrically floating layer and may include a trap rich dielectric material that has a high density of charge traps and may significantly degrade the lifetime and mobility of parasitic charges.

In some embodiments, the trap rich dielectric material of the charge trap layer 12A may include polysilicon, amorphous silicon or a combination thereof. The charge trap layer 12A may have a high density of active dangling bonds which are low energy states for the free charges and may trap the free charges. Accordingly, the density of active free charges in the charge trap layer 12A may be kept very low such that the chance of forming an inversion layer near the interface between the insulating layer 14 and the charge trap layer 12A is vanished.

In some embodiments, the charge trap layer 12A may extend laterally to completely separate the insulating layer 14 from the substrate 10. In some embodiments, the charge trap layer 12A may be formed by directly depositing a trap rich dielectric material on the substrate 10 in a blanket manner through a deposition process such as a chemical vapor deposition (CVD) process. In some embodiments, the charge trap layer 12A may be formed by implanting ions into the upper portion of the substrate 10 to amorphize the crystal structure of the substrate 10.

In a preferred embodiment, the thickness of the charge trap layer 12A is larger than the thickness of the insulating layer 14 and the thickness of the active layer 20. In some embodiments, the thickness of the charge trap layer 12A may be between 50 and 100 nm, the thickness of the insulating layer 14 may be between 10 and 15 nm, and the thickness of the active layer 20 may be between 5 and 10 nm, but are not limited thereto.

The charge trap structure 40A is formed in the active layer 20, extends through the whole thickness of the active layer 20 and surrounds the first device region 22 of the active layer 20. As shown in FIG. 1, the charge trap structure 40A may be formed in a non-device region 23 of the active layer 20 that is separated from the first device region 22 by the isolation structures 28. In other words, the isolation structure 28 is disposed between the charge trap structure 40A and the first device region 22. The top surface of the isolation structures 28 and a top surface of the charge trap structure 40A are approximately flush with an upper surface of the active layer 20. The bottom surface of the charge trap structure 40A directly contacts the upper surface of the insulating layer 14.

As shown in FIG. 2, the charge trap structure 40A may form a closed ring that completely surrounds the periphery of the first device region 22 in the plane view and intervenes between the first device region 22 and the second device region 24 and between the first device region 22 and the third device region 26. It should be understood that the shape of the charge trap structure 40A, the first device region 22, the second device region 24 and the third device region 26 shown in FIG. 2 are only examples and should not limit the scope of the present invention. Other shapes of the charge trap structure 40A, the first device region 22, the second device region 24 and the third device region 26 are available according to design needs.

The charge trap structure 40A may be an electrically floating structure and include a trap rich dielectric material. In some embodiments, the charge trap structure 40A may include polysilicon, amorphous silicon or a combination thereof. In some embodiments, the charge trap structure 40A and the charge trap layer 12A essentially include the same material, such as polysilicon. In some embodiments, the charge trap structure 40A and the charge trap layer 12A essentially include different materials. For example, the charge trap structure 40A essentially includes amorphous silicon and the charge trap layer 12A essentially includes polysilicon. The charge trap structure 40A may have a high density of active dangling bonds that may trap the free charges in the non-device region 23 of the active layer 20. Accordingly, cross-talk between adjacent the first semiconductor device 32 and adjacent semiconductor devices may be reduced.

In some embodiments, the charge trap structure 40A may be formed by performing a trench in the non-device region 23 of the active layer 20 and then filling the trench with the trap rich dielectric material. The trench of the charge trap structure 40A may be formed and filled after forming the isolation structures 28 and before forming the semiconductor devices.

In some embodiments, the charge trap structure 40A may be formed by performing an implant process to implant ions into a pre-determined region of the non-device region 23 to amorphize the crystal structure of the non-device region 23. The implant process may be carried out after forming the semiconductor devices and before forming the first dielectric layer 52.

Please still refer to FIG. 1. A first dielectric layer 52 may be disposed on the active layer 20 and covers the first semiconductor device 32, the second semiconductor device 34 and the third semiconductor device 36. The top surfaces of the isolation structures 28 and the top surface of the charge trap structure 40A are directly covered by the first dielectric layer 52. The first dielectric layer 52 may include a dielectric material such as silicon oxide ($SiO_2$) or low-k dielectric materials such as fluorinated silica glass (FSG), silicon oxycarbide (SiCOH), spin on glass, porous low-k dielectric material, organic dielectric polymers, or a combination thereof, but is not limited thereto.

A plurality of contact structures 38 may be formed in the first dielectric layer 52 to electrically contact the first semiconductor device 32, the second semiconductor device 34 and the third semiconductor device 36. The contact structures 38 may include conductive materials such metals, metal alloys, metal silicides or metal compounds. For example, the contact structures 38 may include tungsten (W), cobalt (Co), copper (Cu), aluminum (Al), titanium (Ti), tantalum (Ta), titanium nitride (TiN), tantalum nitride (TaN), or a combination thereof, but is not limited thereto. In some embodiments, the contact structures 38 may include tungsten (W).

A second dielectric layer 62 may be formed on the first dielectric layer 52. A plurality of interconnecting structures 64 are formed in the second dielectric layer 62 and directly contact the top surfaces of the contact structures 38 that are exposed from the first dielectric layer 52. The interconnecting structures 64 may include conductive materials such metals, metal alloys, metal silicides or metal compounds. For example, the interconnecting structures 64 may include tungsten (W), cobalt (Co), copper (Cu), aluminum (Al), titanium (Ti), tantalum (Ta), titanium nitride (TiN), tantalum nitride (TaN), but not limited thereto. In some embodiments, the interconnecting structures 64 may include tungsten (W).

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 3:
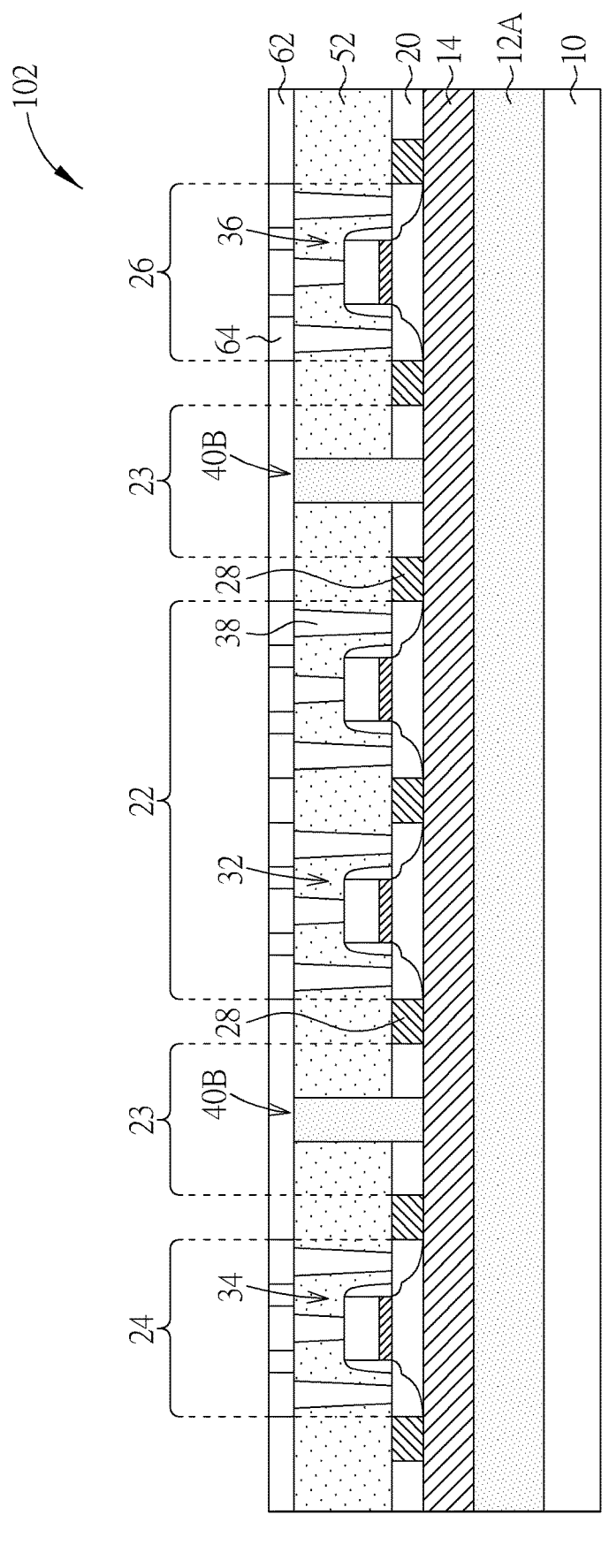
FIG. 3 is a schematic cross-sectional diagram illustrating a portion of a semiconductor structure according to a second embodiment of the present invention.

Please refer to FIG. 3, which is a schematic cross-sectional diagram illustrating a portion of a semiconductor structure 102 according to a second embodiment of the present invention. The semiconductor structure 102 shown in FIG. 3 and the semiconductor structure 101 shown in FIG. 1 are different in that the charge trap structure 40B of the semiconductor structure 102 is formed in the first dielectric layer 52 and the active layer 20. The charge trap structure 40B not only surrounds the first device region 22, but also surrounds a portion of the first dielectric layer 52 vertically above the first device region 22. In the plane view, the charge trap structure 40B may have a closed ring shape as the charge trap structure 40B shown in FIG. 2.

The charge trap structure 40B may be formed after forming the first dielectric layer 52 by filling a trench that extends through the first dielectric layer 52 and the active layer 20 with a trap rich dielectric material, such as polysilicon, amorphous silicon or a combination thereof. A CMP process may be performed to remove the trap rich dielectric material outside the trench. In some embodiments, a top surface of the charge trap structure 40B may be substantially flush with the upper surface of the first dielectric layer 52. In some embodiments, the top surface of the charge trap structure 40B may be directly and completely covered by the second dielectric layer 62. In some embodiments, a top surface of the charge trap structure 40B may be substantially flush with the top surfaces of the contact structures 38. A bottom surface of the charge trap structure 40B may directly contact the upper surface of the insulating layer 14.

In some embodiments, the charge trap structure 40B and the charge trap layer 12A essentially include the same material, such as polysilicon. In some embodiments, the charge trap structure 40B and the charge trap layer 12A essentially include different materials. For example, the charge trap structure 40B essentially includes amorphous silicon and the charge trap layer 12A essentially includes polysilicon.

Figure 4:
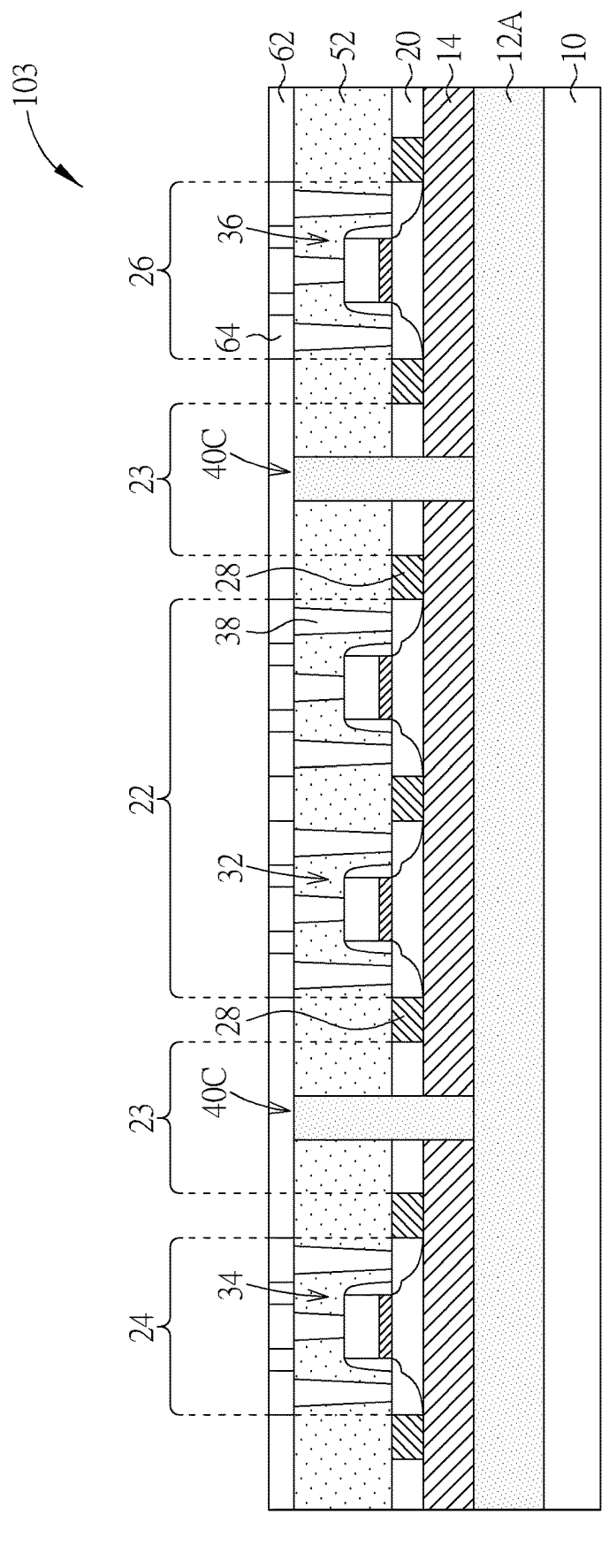
FIG. 4 is a schematic cross-sectional diagram illustrating a portion of a semiconductor structure according to a third embodiment of the present invention.

Please refer to FIG. 4, which is a schematic cross-sectional diagram illustrating a portion of a semiconductor structure 103 according to a third embodiment of the present invention. The semiconductor structure 103 shown in FIG. 4 and the semiconductor structure 101 shown in FIG. 1 are different in that the charge trap structure 40C of the semiconductor structure 103 extends through the first dielectric layer 52, the active layer 20 and the insulating layer 14. The charge trap structure 40C not only surrounds the first device region 22, but also surrounds a portion of the first dielectric layer 52 vertically above the first device region 22 and a portion of the insulating layer 14 vertically below the first device region 22. The charge trap structure 40C may have a closed ring shape as the charge trap structure 40B shown in FIG. 2.

The charge trap structure 40C is formed after forming the first dielectric layer 52 by filling a trench that extends through the first dielectric layer 52, the active layer 20 and the insulating layer 14 with a trap rich dielectric material, such as polysilicon, amorphous silicon or a combination thereof. A CMP process may be performed to remove the trap rich dielectric material outside the trench. A bottom surface of the charge trap structure 40C directly contacts the upper surface of the charge trap layer 12A. The charge trap structure 40C and the charge trap layer 12A collectively form a bowl-like charge trap structure enclosing the first device region 22.

Figure 5:
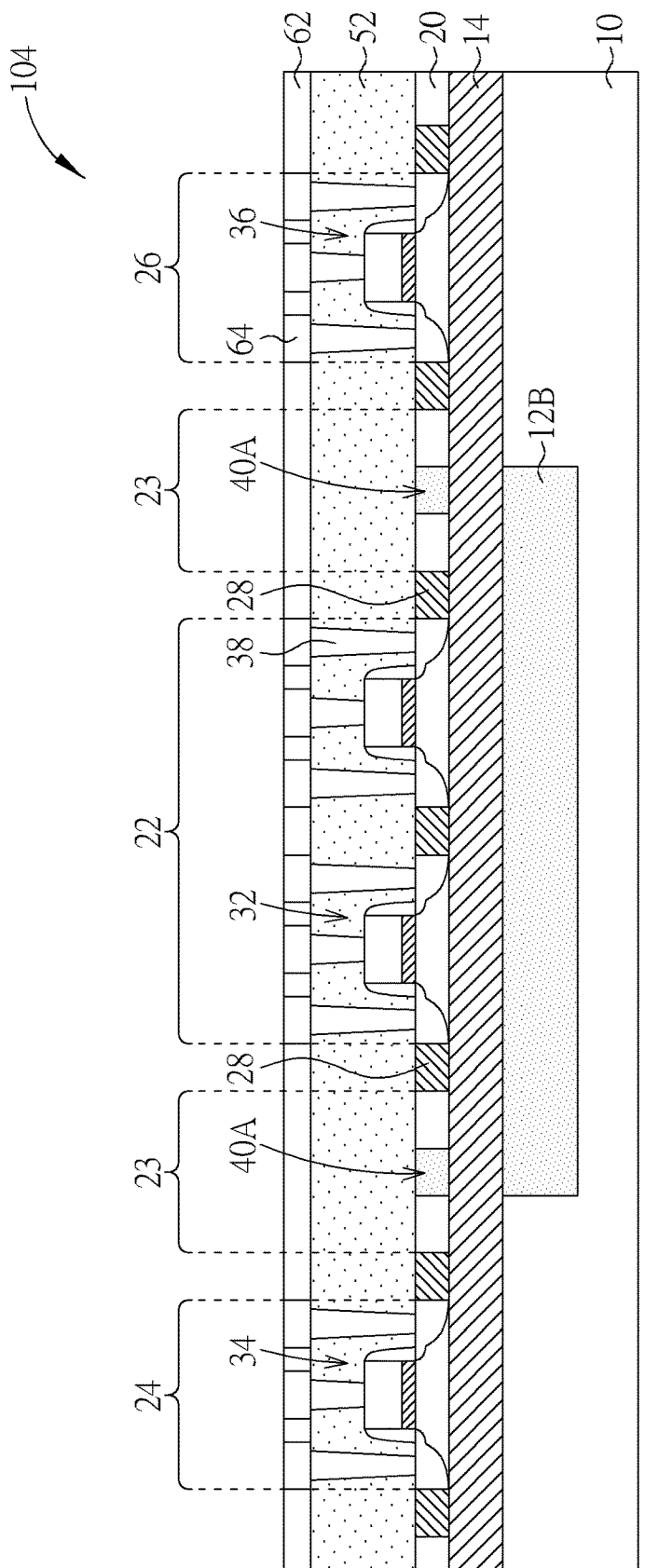
FIG. 5 is a schematic cross-sectional diagram illustrating a portion of a semiconductor structure according to a fourth embodiment of the present invention.

Please refer to FIG. 5, which is a schematic cross-sectional diagram illustrating a portion of a semiconductor structure 104 according to a fourth embodiment of the present invention. The semiconductor structure 104 shown in FIG. 5 and the semiconductor structure 101 shown in FIG. 1 are different in that the charge trap layer 12B of the semiconductor structure 104 is formed in a portion of the substrate 10 corresponding to the first device region 22. The charge trap layer 12B extends laterally to underlie the first device region 22, the isolation structures 28 near first device region 22, a portion of the non-device region 23 and the charge trap structure 40A surrounding the first device region 22. The charge trap layer 12B does not underlie the second device region 24 and the third device region 26.

In some embodiments, the charge trap layer 12B may be formed by filling a recessed region in the substrate 10 with a trap rich dielectric material. A CMP process may be performed to remove the trap rich dielectric material outside the recessed. In some embodiments, charge trap layer 12B may be formed by implanting ions into a pre-determined region of the substrate 10 to amorphize the crystal structure of the substrate 10. As shown in FIG. 5, the upper surface of the charge trap layer 12B may be substantially flush with the upper surface of the substrate 10.

Figure 6:
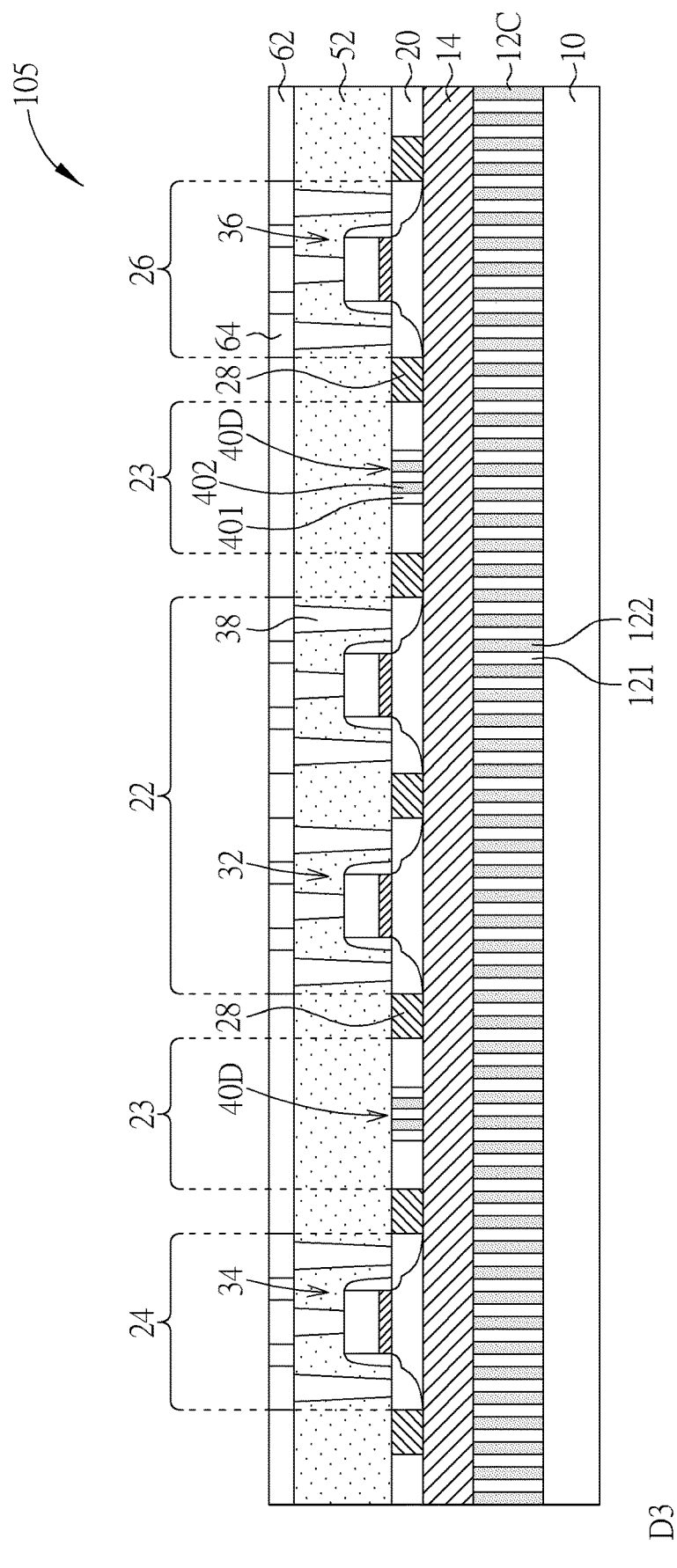
FIG. 6 is a schematic cross-sectional diagram illustrating a portion of a semiconductor structure according to a fifth embodiment of the present invention.
Figure 6A:
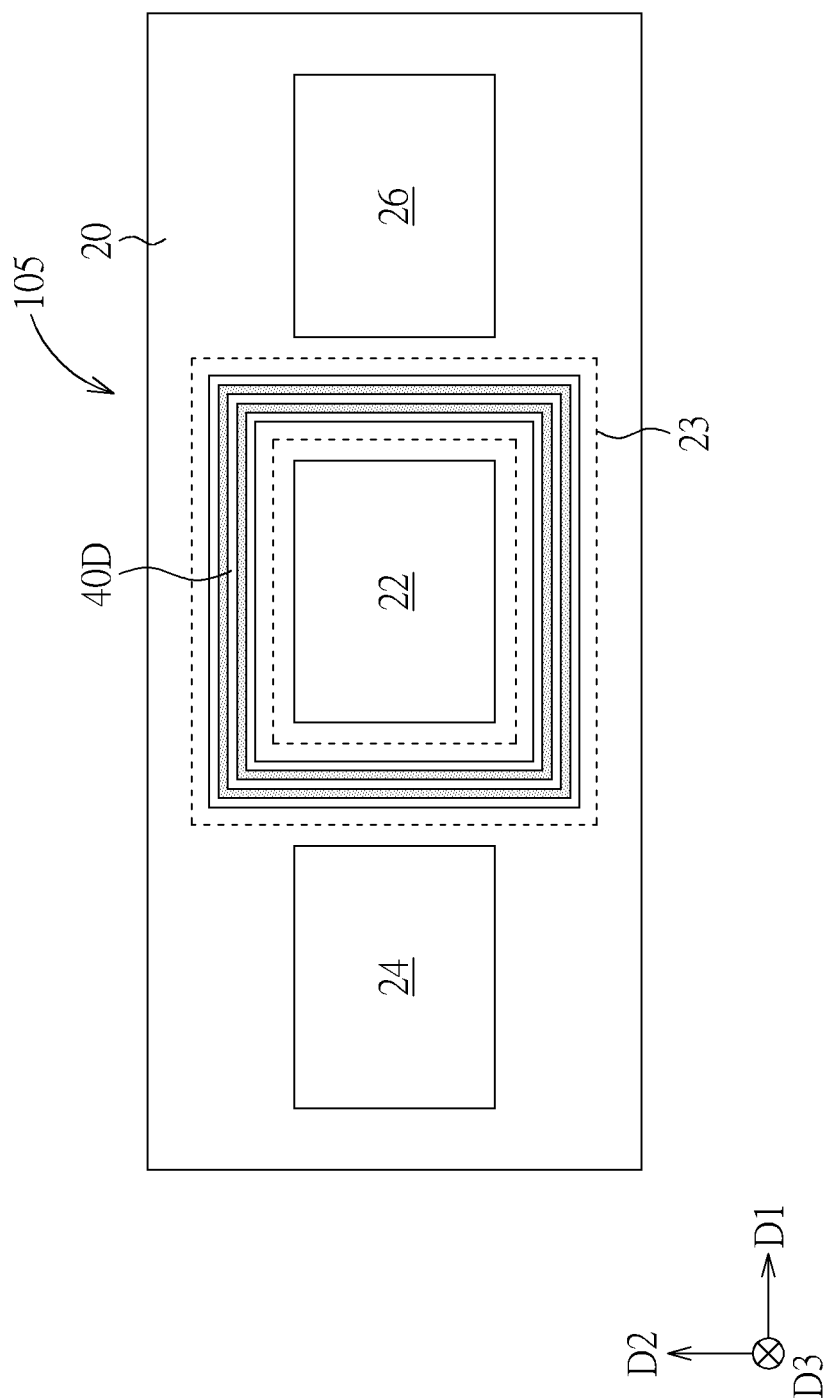
FIG. 6A is a schematic plane view showing a portion of the semiconductor structure in FIG. 6.

Please refer to FIG. 6 and FIG. 6A. FIG. 6 is a schematic cross-sectional diagram along the first direction D1 and the third direction D3 to show a portion of a semiconductor structure 105 according to a fifth embodiment of the present invention. FIG. 6A is a schematic plane view along the first direction D1 and the second direction D2 to show a portion of the semiconductor structure 105 shown in FIG. 6. For the sake of simplicity, some structures (such as isolation structures, semiconductor devices, dielectric layers, contact structures, interconnecting structures) are omitted in FIG. 6A.

The semiconductor structure 105 shown in FIG. 6 and FIG. 6A and the semiconductor structure 101 shown in FIG. 1 and FIG. 2 are different in that the charge trap structure 40D of the semiconductor structure 105 shown in FIG. 6 and FIG. 6A include a plurality of alternately arranged first doped regions 401 and second doped regions 402. The charge trap layer 12C of the semiconductor structure 105 includes a plurality of alternately arranged third doped regions 121 and fourth doped regions 122.

The first doped regions 401 and the second doped regions 402 of the charge trap structure 40D may be formed by implanting dopants into a pre-determined region of the non-device region 23 of the active layer 20. The first doped regions 401 and the second doped regions 402 are alternately arranged to form a multiple concentric ring surrounding the first device region 22. More important, the first doped regions 401 and the second doped regions 402 have complementary conductive types to form a plurality of interrupted depletion junctions surrounding the first device regions 22. In some embodiments, the first doped regions 401 may have n-type conductivity and includes n-type dopants such as phosphorus (P), arsenic (As) or the like. The second doped regions 402 may have p-type conductivity and includes p-type dopants such as boron (B) or the like. The depletion junctions of the charge trap structure 40D are like a chain of series capacitors that may trap the parasitic free charges in the non-device region 23 of the active layer 20. Accordingly, cross-talk between the first semiconductor device 32 in the first device region 22 and other semiconductor devices in nearby device regions may be reduced. In some embodiments, the charge trap structure 40D may be an electrically floating structure.

The third doped regions 121 and fourth doped regions 122 of the charge trap layer 12C may be formed by implanting dopants into the upper portion of the substrate 10. The upper surface of the charge trap layer 12C is substantially the upper surface of the substrate 10. In some embodiments, the third doped regions 121 and fourth doped regions 122 are alternately arranged along the first direction D1. More important, the third doped regions 121 and the fourth doped regions 122 have complementary conductive types to form a plurality of interrupted depletion junctions in the substrate 10 to underlie the first device regions 22, the second device region 24 and the third device region 26. The depletion junctions of the charge trap layer 12C are like a chain of series capacitors that may trap the free parasitic charges near the upper surface of the substrate 10 induced by the insulating layer 14. Accordingly, the parasitic surface conduction (PSC) phenomenon may be reduced. In some embodiments, the charge trap layer 12C may be an electrically floating layer.

In a preferred embodiment, the depth of the charge trap layer 12C is larger than the thickness of the insulating layer 14 and the thickness of the active layer 20. In some embodiments, the depth of the charge trap layer 12C may be between 50 and 100 nm, but not limited thereto.

Figure 7:
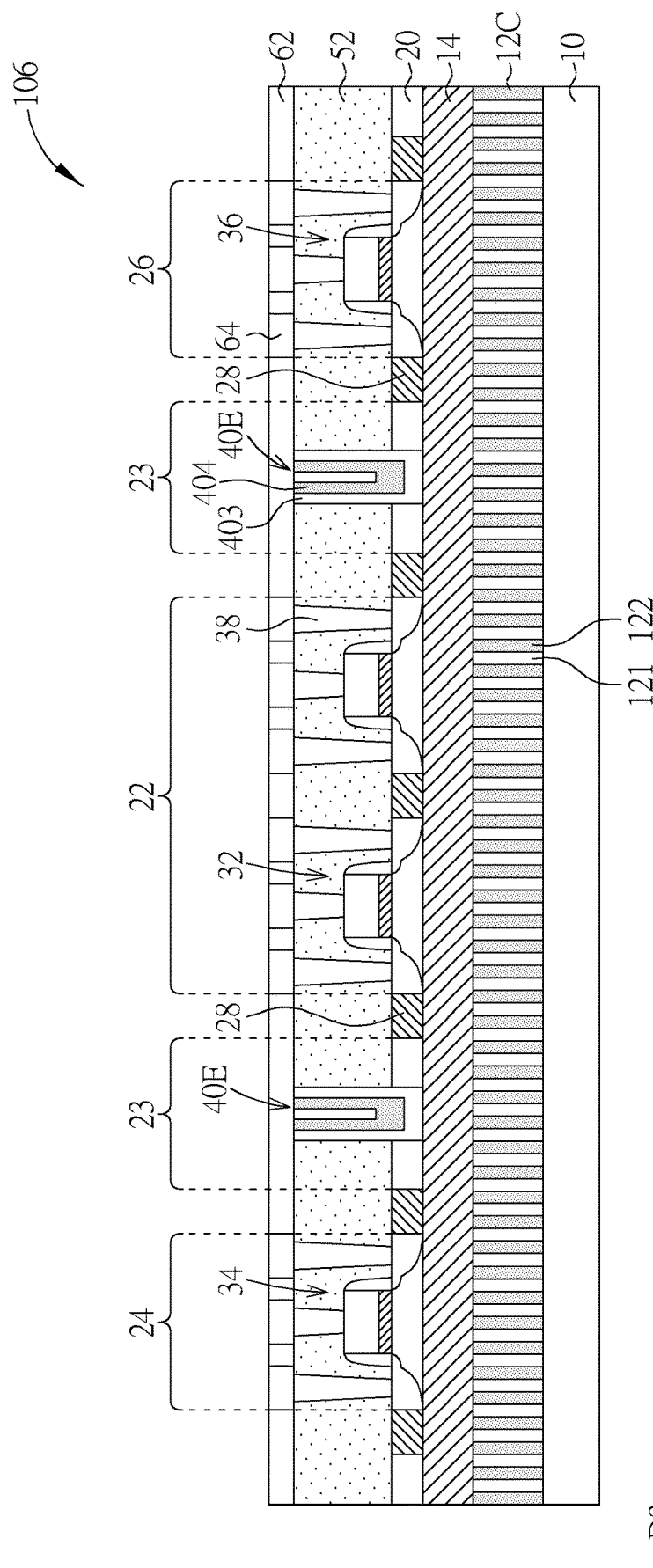
FIG. 7 is a schematic cross-sectional diagram illustrating a portion of a semiconductor structure according to a sixth embodiment of the present invention.

Please refer to FIG. 7, which is a schematic cross-sectional diagram illustrating a portion of a semiconductor structure 106 according to a sixth embodiment of the present invention. The semiconductor structure 106 shown in FIG. 7 and the semiconductor structure 105 shown in FIG. 6 are different in that the charge trap structure 40E of the semiconductor structure 106 is formed in the active layer 20 and the first dielectric layer 52 by filling a trench with a plurality of doped semiconductor layers 403 and 404.

The charge trap structure 40E may be formed after forming the first dielectric layer 52 by filling a trench that extends through the first dielectric layer 52 and the active layer 20 by alternately depositing the doped semiconductor layers 403 and 404 into the trench. The materials of the doped semiconductor layers 403 and 404 may include amorphous silicon, polysilicon or crystalline silicon, but are not limited thereto. The doped semiconductor layers 403 and 404 may have complementary conductive types and may form a plurality of interrupted depletion junctions surrounding the first device regions 22 and a portion of the first dielectric layer 52 vertically above the first device regions 22. In some embodiments, the doped semiconductor layer 403 may be n-type, and the doped semiconductor layer 404 may be p-type.

Figure 8:
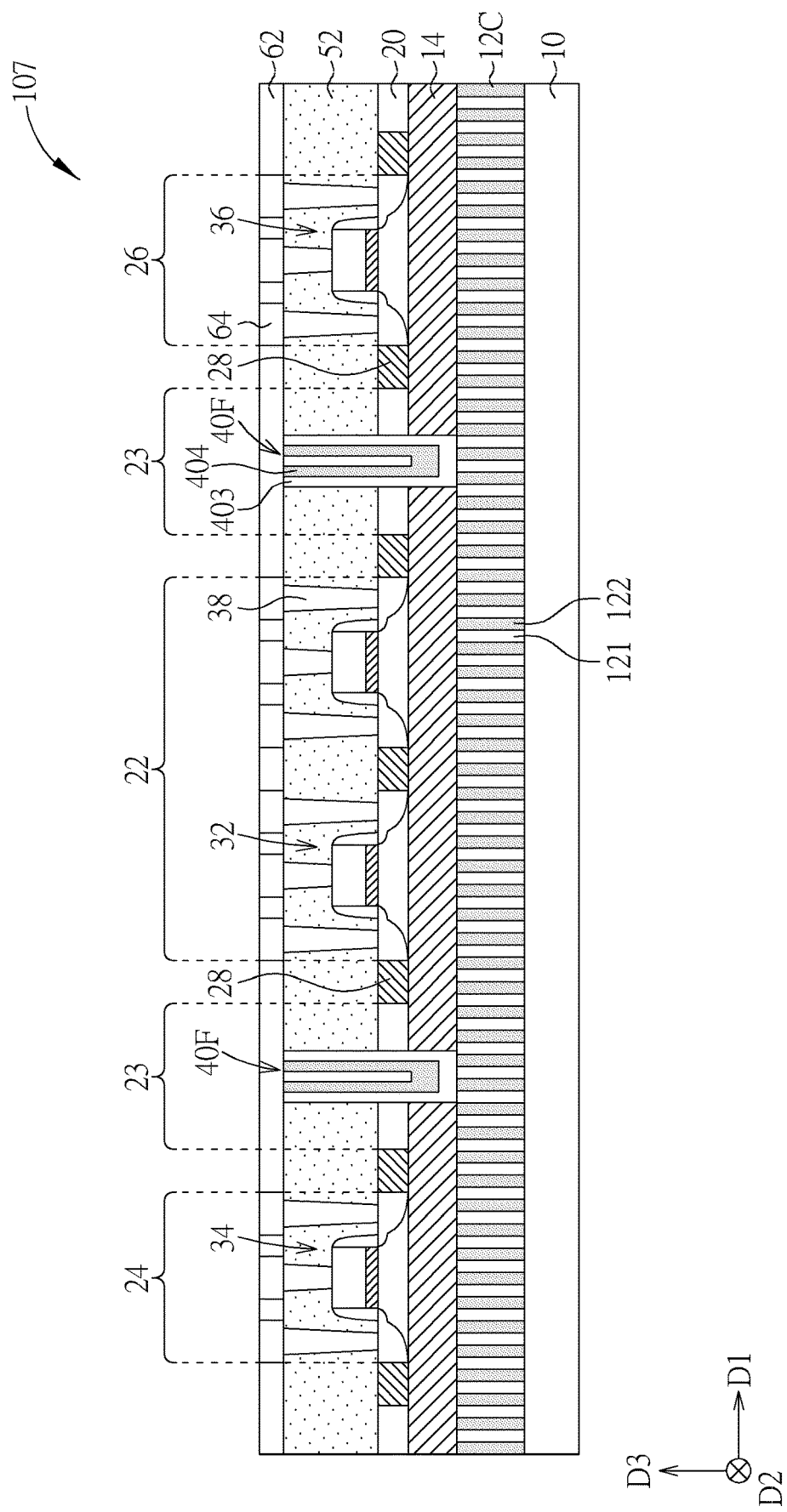
FIG. 8 is a schematic cross-sectional diagram illustrating a portion of a semiconductor structure according to a seventh embodiment of the present invention.

Please refer to FIG. 8, which is a schematic cross-sectional diagram illustrating a portion of a semiconductor structure 107 according to a seventh embodiment of the present invention. The semiconductor structure 107 shown in FIG. 8 and the semiconductor structure 105 shown in FIG. 6 and FIG. 6A are different in that the charge trap structure 40F of the semiconductor structure 107 is formed in the active layer 20, the first dielectric layer 52 and the insulating layer 14 by filling a trench with a plurality of doped semiconductor layers 403 and 404. A bottom surface of the charge trap structure 40F directly contacts the upper surface of the charge trap layer 12C. The charge trap structure 40F and the charge trap layer 12C collectively form a bowl-like charge trap structure enclosing the first device region 22.

Figure 9:
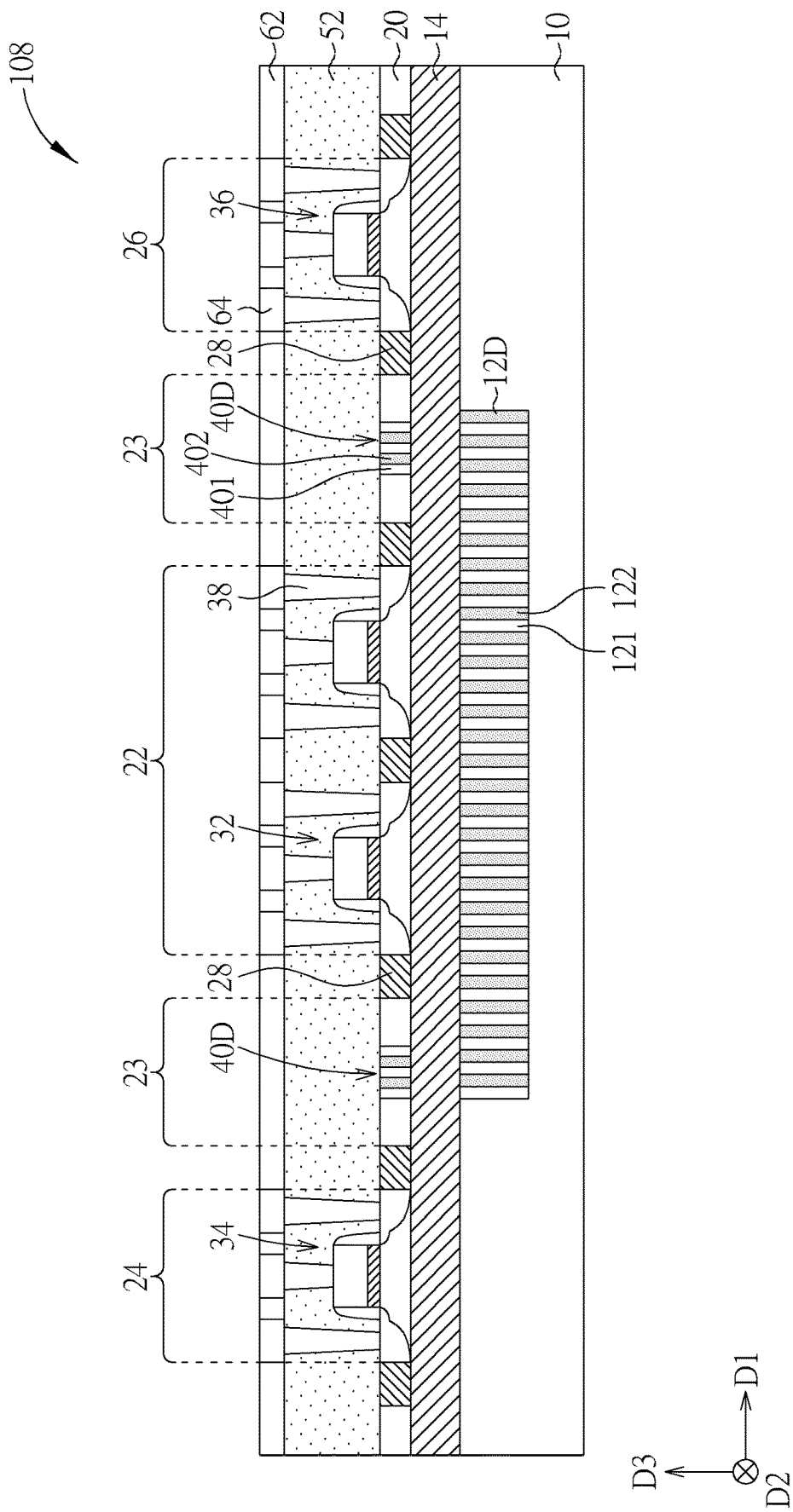
FIG. 9 is a schematic cross-sectional diagram illustrating a portion of a semiconductor structure according to an eighth embodiment of the present invention.

Please refer to FIG. 9, which is a schematic cross-sectional diagram illustrating a portion of a semiconductor structure 108 according to an eighth embodiment of the present invention. The semiconductor structure 108 shown in FIG. 9 and the semiconductor structure 105 shown in FIG. 6 and FIG. 6A are different in that the charge trap layer 12D of the semiconductor structure 108 is formed in a portion of the substrate 10 corresponding to the first device region 22. The charge trap layer 12D extends laterally to underlie the first device region 22, the isolation structures 28 near first device region 22, a portion of the non-device region 23, and the charge trap structure 40D surrounding the first device region 22. The charge trap layer 12D does not underlie the second device region 24 and the third device region 26.

Figure 10:
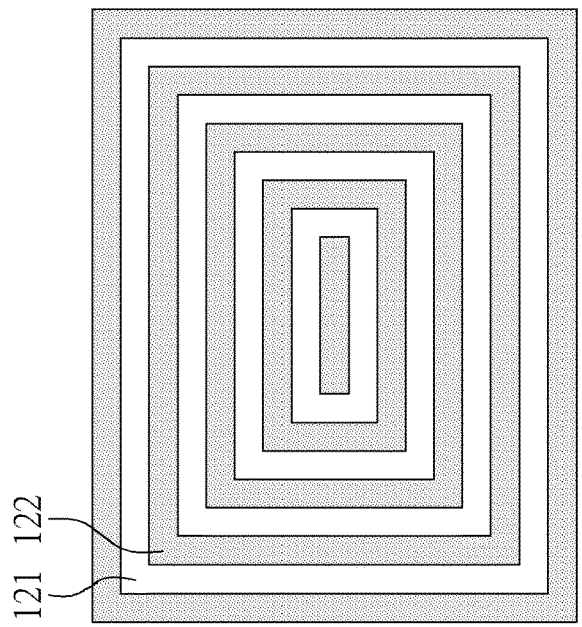
FIG. 10 shows some plane views of the third doped regions and the fourth doped regions of the charge trap layer according to some embodiments of the present invention.
Figure 10:
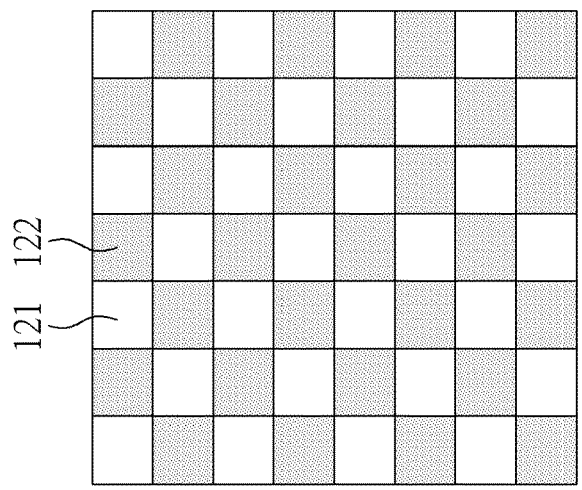
Figure 10:
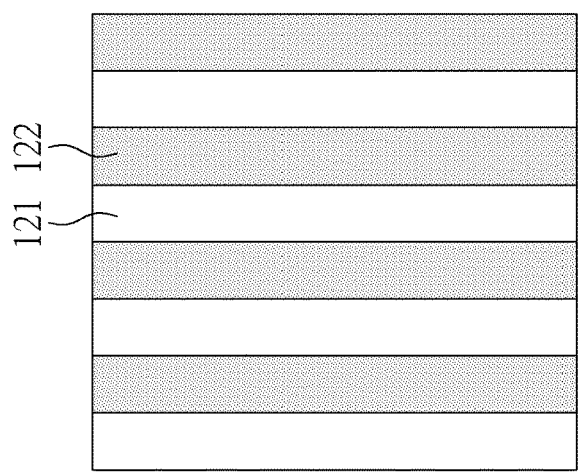
Figure 10:
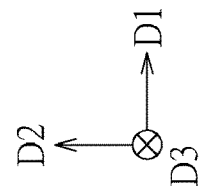

Please refer to FIG. 10, which shows some plane views of the third doped regions 121 and the fourth doped regions 122 of the charge trap layer 12C or the charge trap layer 12D according to some embodiments of the present invention. As shown in the left portion of FIG. 10, the third doped regions 121 and the fourth doped regions 122 may have stripe shapes extending along the second direction D2 and are alternately arranged along the first direction D1.

As shown in the middle portion of FIG. 10, the third doped regions 121 and the fourth doped regions 122 may have rectangular shapes and are alternately arranged along the first direction D1 and the second direction D2 to form an array. As shown in the right portion of FIG. 10, the third doped regions 121 and the fourth doped regions 122, except the central one, may have closed-ring shapes and are alternately arranged to form a multiple concentric ring.

It should be understood that, the semiconductor structure according to the present invention may be provided by mix using the different types of charge trap layers and the charge trap structures illustrated in previous embodiments. For example, in an embodiment of the present invention, a semiconductor structure may have a charge trap layer made of a trap rich dielectric material and a charge trap structure made of doping regions. In another embodiment of the present invention, a semiconductor structure may have a charge trap layer made of doping regions and a charge trap structure made of a trap rich dielectric material.

In conclusion, it can be understood that the semiconductor structure of this invention is capable of improving signal transmission characteristics and preventing signal distortion by introducing the charge trap layer between the substrate and the insulating layer and the charge trap structure in the active layer and surrounding the critical device regions. The charge trap layer and the charge trap structure may trap and/or obstruct the conduction of the parasitic charges. Accordingly, harmonic distortion of the semiconductor devices and cross-talk between semiconductor devices caused by parasitic free charges may be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a substrate;
an insulating layer disposed on the substrate;
an active layer disposed on the insulating layer;
a plurality of isolation structures in the active layer to define a first device region and a non-device region of the active layer, wherein the isolation structures, the first device region and the non-device region occupy mutually exclusive regions of the active layer, and the isolation structures are at two sides of the non-device region and separate the first device region and the non-device region from each other;
a first semiconductor device formed on the first device region of the active layer; and
a charge trap structure extending through the non-device region of the active layer, wherein in a plane view, the charge trap structure and the non-device region form concentric closed rings surrounding the first device region.

2. The semiconductor structure according to claim 1, further comprising a first dielectric layer disposed on the active layer and covering the first semiconductor device.

3. The semiconductor structure according to claim 2, wherein the first dielectric layer completely covers a top surface of the charge trap structure.

4. The semiconductor structure according to claim 2, wherein the charge trap structure extends through the first dielectric layer and a top surface of the charge trap structure is flush with an upper surface of the first dielectric layer.

5. The semiconductor structure according to claim 4, further comprising a second dielectric layer disposed on the first dielectric layer and completely covering a top surface of the charge trap structure.

6. The semiconductor structure according to claim 2, further comprising a contact structure formed in the first dielectric layer and electrically connecting the first semiconductor device, wherein the charge trap structure and the contact structure comprise different materials.

7. The semiconductor structure according to claim 6, wherein a top surface of the contact structure is flush with a top surface of the charge trap structure.

8. The semiconductor structure according to claim 1, wherein the charge trap structure is electrically floating.

9. The semiconductor structure according to claim 1, wherein the charge trap structure comprises amorphous silicon.

10. The semiconductor structure according to claim 1, wherein the charge trap structure comprises a plurality of first doped regions and a plurality of second doped regions, and in the plane view the first doped regions and the second doped regions are alternately arranged to form concentric closed rings surrounding the first device region, wherein the first doped regions and the second doped regions have complementary conductive types.

11. The semiconductor structure according to claim 1, wherein the charge trap structure comprises a plurality of first doped semiconductor layers and second doped semiconductor layers that are alternately stacked in a trench in the active layer, wherein the first doped regions and the second doped regions have complementary conductive types.

12. The semiconductor structure according to claim 1, further comprising a charge trap layer between the insulating layer and the substrate and extending laterally to underlie the first device region and the charge trap structure.

13. The semiconductor structure according to claim 12, wherein the charge trap structure extends through the insulating layer and contacts an upper surface of the charge trap layer.

14. The semiconductor structure according to claim 12, wherein the charge trap layer comprises polysilicon.

15. The semiconductor structure according to claim 12, wherein the charge trap layer comprises a plurality of third doped regions and a plurality of fourth doped regions alternately arranged along a first direction in the plane view, wherein the third doped regions and the fourth doped regions have complementary conductive types.

16. The semiconductor structure according to claim 12, wherein the charge trap layer comprises a plurality of third doped regions and a plurality of fourth doped regions alternately arranged along a first direction and a second direction to form an array in the plane view, wherein the third doped regions and the fourth doped regions have complementary conductive types.

17. The semiconductor structure according to claim 12, wherein the charge trap layer comprises a plurality of third doped regions and a plurality of fourth doped regions alternately arranged to form concentric closed rings in the plane view, wherein the third doped regions and the fourth doped regions have complementary conductive types.

18. The semiconductor structure according to claim 12, wherein the charge trap layer is disposed in the substrate and a top surface of the charge trap layer is flush with an upper surface of the substrate.

19. The semiconductor structure according to claim 12, further comprising a second semiconductor device formed on a second device region of the active layer, wherein the charge trap structure intervenes between the first device region and the second device region.

20. The semiconductor structure according to claim 1, wherein the charge trap structure and the isolation structures are not in direct contact with each other by being separated by the non-device region of the active layer.

* * * * *